United States Patent [19]
Holmquist

[11] Patent Number: 5,308,688
[45] Date of Patent: May 3, 1994

[54] OXIDATION RESISTANT DIAMOND COMPOSITE AND METHOD OF FORMING THE SAME

[75] Inventor: Glenn A. Holmquist, Carlsbad, Calif.

[73] Assignee: Hughes Missile Systems Company, Los Angeles, Calif.

[21] Appl. No.: 997,389

[22] Filed: Dec. 28, 1992

[51] Int. Cl.$^5$ ............................................. B32B 7/02
[52] U.S. Cl. ................................... 428/216; 428/336; 428/408; 428/698
[58] Field of Search ................ 428/408, 698, 336, 216

[56] References Cited

U.S. PATENT DOCUMENTS

| | | | |
|---|---|---|---|
| 3,719,519 | 3/1973 | Perugini | 428/633 |
| 3,727,028 | 4/1973 | Kuratomi | 219/149 |
| 4,056,457 | 11/1977 | Vossen, Jr. | 428/469 |
| 4,098,956 | 7/1978 | Blickensderfer et al. | 428/469 |
| 4,420,142 | 12/1983 | Dworak et al. | 251/368 |
| 4,650,498 | 3/1987 | Bulian | 51/309 |
| 4,663,640 | 5/1987 | Ikeda | 346/140 R |
| 4,670,025 | 6/1987 | Pipkia | 51/295 |
| 4,737,011 | 4/1988 | Iri et al. | 350/96.2 |
| 4,809,293 | 2/1989 | DeBell et al. | 372/95 |
| 4,847,163 | 7/1989 | Shimamune et al. | 428/469 |

FOREIGN PATENT DOCUMENTS 2351835  11/1983  Fed. Rep. of Germany.

*Primary Examiner*—A. A. Turner
*Attorney, Agent, or Firm*—Charles D. Brown; Randall M. Heald; Wanda K. Denson-Low

[57] ABSTRACT

The improved diamond composite (10) exhibits increased oxidation resistance at elevated temperatures, as well as anti-reflective properties. The composite (10) includes a diamond (12), the surfaces (14) of which are protected by an adherent coating (16) consisting essentially of a layer (18) of hafnium carbide adhering and chemically bonded to the diamond (12), a layer (20) of hafnium oxy-carbide adhering and chemically bonded to the hafnium carbide layer (18) and an oxidation-resistant layer (22) of hafnium oxide adhering and chemically bonded to the hafnium oxy-carbide layer (20). Preferably, the coating (16) is sufficiently thin so that it or at least the hafnium oxide layer (22) thereof has about one-quarterwavelength thickness. The method of forming the composite (10) employs sputtering hafnium metal in an argon atmosphere, preferably at about 100°150 degrees Celsius, to form the hafnium carbide layer (18), then continuing the sputtering in an oxygen and argon mixture to first form the hafnium oxy-carbide layer (20) and then the hafnium oxide layer (22). The sputtering is followed by heat treating the composite (10) in an oxygen atmosphere at preferably about 350-450 degrees Celsius for about 4-24 hours to assure full utilization of the hafnium metal. This method is simple, inexpensive and effective.

1 Claim, 1 Drawing Sheet

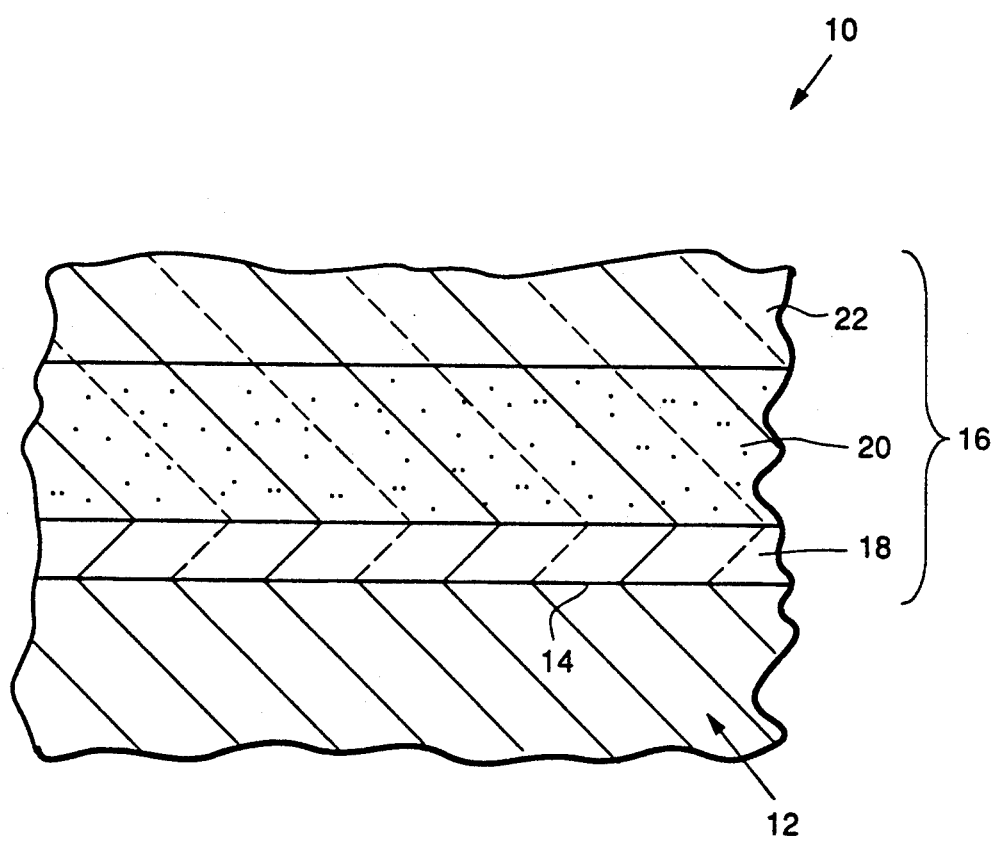

OXIDATION RESISTANT DIAMOND COMPOSITE AND METHOD OF FORMING THE SAME

BACKGROUND OF THE INVENTION

1. Field of the Invention

The present invention generally relates to diamond composites and more particularly to diamond composites exhibiting improved high-temperature-oxidation-resistance and anti-reflective properties.

2. Description of the Related Art

Diamond offers a number of well-known desirable physical properties including hardness, toughness, optical clarity, high index of refraction, etc. which render it potentially useful in various electronic and optical devices. However, until recently diamond was commercially available only in relatively small and usually substantially occluded pieces. The synthetic production of diamond now has reached a stage where relatively large pieces of diamond of good optical clarity are available at reasonable prices. Accordingly, there is now an opportunity to use synthetic diamonds in a wide variety of devices.

Some potential applications for diamonds are in environments, however, where they would be exposed to elevated temperatures in oxidizing atmospheres. Unfortunately, when a diamond is exposed to oxygen above 550 degrees Celsius, it reacts readily with oxygen to form carbon dioxide, and thus the diamond is vaporized.

Therefore, it would be highly desirable to be able to provide means for inexpensively and efficiently protecting diamonds against oxidation at high temperatures. Any oxidation-resistant high-temperature-protective coating would have to strongly adhere to the diamond for maximum long-term protection. Moreover, it should not degrade the optical properties of the diamond. Such coating should be capable of being formed on the diamond without damage to the diamond and by means of an inexpensive and rapid method. An added benefit would result if the coating could provide the diamond surface with anti-reflective properties.

SUMMARY OF THE INVENTION

The improved method of the present invention and the diamond composite produced by the method satisfy all the foregoing needs. The method and composite are substantially as set forth in the Abstract of the Disclosure.

Thus, the method comprises RF (radio frequency) sputtering hafnium metal onto the surfaces of a diamond in an oxygen-free argon atmosphere while maintaining the diamond at an elevated temperature not in excess of about 400 degrees Celsius, preferably about 100–150 degrees Celsius, to form in situ a layer of hafnium carbide which strongly adheres to the diamond surfaces. The sputtering is typically carried out at about 5–25 milliTorr pressure and at a power level of less than about 1 KVA with a conventional RF sputtering chamber. The sputtering is continued while and after oxygen is introduced into the argon atmosphere, preferably at about 10–40 volume percent of oxygen. This results in the formation of an adherent layer of hafnium oxy-carbide on the exposed surfaces of the hafnium carbide layer. Sputtering is then continued under the same conditions until an adherent layer of hafnium oxide is formed on the exposed surfaces of the hafnium oxy-carbide layer.

These layers form a unitary coating which is high-temperature-oxidation-resistant and which tightly adheres to the diamond surface for maximum protection. The coating plus the diamond form the desired composite.

The thickness of the layers in the coating is controlled so that the optical properties of the diamond are not impaired. The hafnium carbide layer is preferably less than 200 angstroms thick, the hafnium oxy-carbide layer is preferably less than 600 angstroms thick and the hafnium oxide layer is preferably only about one-quarter-wavelength optical thickness at a desired wavelength. Preferably, the coating has a desired anti-reflective property. This method is simple, inexpensive and efficient, and the resulting composite is very durable, significantly increasing the utility of the diamond.

Various other features of the improved method and composite of the present invention are set forth in the following detailed description and drawings.

BRIEF DESCRIPTION OF THE DRAWING

A better understanding of the present invention may be gained from a consideration of the single figure which is an enlarged schematic cross-section, partly broken away, of a preferred embodiment of the improved diamond composite of the present invention.

DETAILED DESCRIPTION OF THE PREFERRED EMBODIMENT

A preferred embodiment of the improved diamond composite of the present invention is schematically depicted in the single figure of the accompanying drawing. Here is shown composite 10 which comprises a diamond 12 having a surface 14 to which coating 16 is tenaciously adhered. Coating 16 comprises a layer 18 of hafnium carbide directly against and chemically bonded to surface 14, a layer 20 of hafnium oxy-carbide adhering and chemically bonded to layer 18 and a layer 22 of hafnium oxide adhering and chemically bonded to layer 20. Coating 16 is integral and unitary in that layers 18, 20, and 22 thereof are tightly and permanently chemically interconnected. It will be understood that layers 18, 20 and 22 are not necessarily shown in true proportional thicknesses in the figure.

Layer 22 is directly exposed to the atmosphere and surface 14 of diamond 12 is fully protected from the atmosphere by coating 16 so that diamond 12 does not oxidize in an oxygen atmosphere at very high temperatures. The hafnium oxide layer 22 is fully resistant to high temperature oxidation.

If layer 22 were applied directly to surface 14, it would not tightly and permanently adhere thereto. A chemical bond is necessary for strong bonding of diamond to an oxide. But hafnium oxide does not chemically bond to diamond. Instead, the described multilayer coating 16 is required for tenacious adhesion of layer 22 of hafnium oxide over the surfaces of diamond 12 to fully protect it.

In order to form the necessary chemical bond, intermediate layers 18 and 20 are required. Thus, the carbon of the diamond must first chemically bond to layer 18 of hafnium carbide formed of sputtered hafnium metal and diamond carbon. Hafnium oxy-carbide is then formed from oxygen and chemically bonds as layer 20 to the hafnium carbide layer 18 in the presence of oxygen. It is to the hafnium oxy-carbide layer 20 that the hafnium oxide chemically bonds as layer 22, completing the formation of tenacious chemically bonded coating 16 around diamond 12.

Preferably, coating 16 is very thin, fully transparent and non-reflective. For this purpose it is preferred that the hafnium carbide layer 18 be less than about 200 angstroms thick, while the hafnium oxy-carbide layer 20 is less than about 600 angstroms thick and the hafnium oxide layer 22 is sufficiently thin to provide a quarterwavelength optical thickness (QWOT) at the desired wavelength application. The resulting diamond composite 10 has superior properties enabling its use in high temperature oxidative environments which would rapidly degrade unprotected diamonds.

The improved method of the present invention is directed to the formation of the oxidation-resistant diamond composite. The method comprises the following steps:

1. Sputtering hafnium metal onto the surface of a selected diamond substrate in an oxygen-free argon atmosphere until hafnium carbide forms as a layer on, and chemically bonded to, the diamond surfaces;

2. Continuing the sputtering while and after introducing a controlled concentration of oxygen into the argon atmosphere, thereby forming an adherent layer of hafnium oxy-carbide on, and chemically bonded to, the hafnium carbide layer; and 3. Further continuing the sputtering in the oxygen and argon atmosphere until an adherent layer of oxidation-resistant hafnium oxide forms on and is chemically bonded to the hafnium oxy-carbide layer.

The thus-deposited layers chemically bond to each other in adjacent pairs to form the desired unitary coating which is strongly adherent to the underlying surfaces of the diamond.

It will be understood that inasmuch as steps 2 and 3 utilize the same processing conditions, they can be viewed, if desired, as, respectively, the earlier and later stages of the same step, differing only in the type of adherent layer being formed.

A fourth step is then carried out to heat treat the composite in oxygen until essentially all the hafnium metal which has been deposited during the sputtering steps has been utilized (reacted) in the layers of the coating.

The first three steps of the present method are carried out in an RF sputtering device utilizing preferably about 5–25 milliTorr pressure, with a power level preferably less than about 1 KVA. The device typically employs a substrate heater, 2 KVA sputtering power supply, 600 watt back sputtering power supply, magnet assisted plasma containment device (MAGNETRON) and high vacuum evacuation system.

In the first step, oxygen-free argon forms the atmosphere in the device, while in the next two steps oxygen is also present with the argon, in a volume concentration of the oxygen to the argon of about 10–40 percent. The temperature of the diamond surfaces in the first three steps is not in excess of about 400 degrees Celsius, but much preferably is about 100–150 degrees Celsius. Heating the diamond to that preferred temperature range limits the thickness of the hafnium carbide layer to less than about 200 angstroms, an ideal thickness for most purposes. Heating the diamond to up to about 400–450 degrees Celsius would result in a substantially thicker hafnium carbide layer, up to about 400 angstroms, which would compromise the adhesion of the hafnium oxy-carbide and the hafnium oxide to the diamond. Heating to above about 550 degrees Celsius would oxidize the diamond in steps 2 and 3 of the method.

The sputtering in the first step is preferably carried out until about 200–300 angstroms of hafnium metal have been deposited. The sputtering in the next two steps is preferably carried out until the thickness of the final coating is sufficient for optimal protection while retaining optical transparency. The sputtering in steps 2 and 3 is preferably carried out until the coating thickness is QWOT (quarterwave optical thickness) at the desired wavelength. Typical for most applications is a wavelength of about 10.6 microns. The QWOT is 10.6, divided by 4 and the refractive index of the diamond material (1.9). This equals 1.39 microns, or 13,900 angstroms.

The fourth step of the present method is carried out by heating the composite in air at about 350–450 degrees Celsius for about 4–24 hours until all sputtered hafnium metal has been reacted in the coating of the composite.

The following specific examples further illustrate certain features of the present method.

EXAMPLE I

A generally rectangular, flat, about 1 carat diamond piece was first cleaned and degreased and then mounted in a conventional RF sputtering deposition chamber. The pressure in the chamber was reduced to 12 milliTorr and the gas in the chamber was 100 percent argon. Planetary rotation of the sample in the chamber was set to 25 percent of maximum. The system tooling factor was set at 86, resulting in readings 8.8 times actual readings, but allowing the system to operate in an optimal dynamic range. Backsputtering was then carried out for 5 minutes, followed immediately by sputtering hafnium metal to a thickness reading of 2200 angstroms, utilizing an automatic sputter rate of 4 angstroms per second.

The gas composition was then immediately changed in the sputtering chamber to 60 volume percent argon and 40 volume percent oxygen at the previously indicated pressure while sputtering was continued at a constant RF power of 350 watts and until a hafnium oxide layer thickness reading of 1000 angstroms was obtained.

The system was then turned off and the diamond was allowed to cool, after which the system was opened and the diamond was then turned over and the entire coating process was repeated. Thereafter the fully coated diamond was removed from the sputtering chamber, placed in an air furnace and heated at 400 degrees Celsius for 15 minutes, then removed and cooled in air to provide the finished composite. The composite was high-temperature oxidation- resistant, and had a strongly adherent coating over all diamond surfaces, which coating was non-reflective and transparent. The method was shown to be rapid, inexpensive and effective to provide the desired composite.

EXAMPLE II

A second diamond sample substantially identical in size and shape to that of Example I was coated substantially in accordance with the method of Example I to provide a high- temperature, oxidation-resistant composite. The parameters of Example I were changed only as follows:

1) Backsputtering was carried out at 40 milliTorr with sputtering at 8 milliTorr in argon and at 14 milliTorr in the oxygen-argon mixture.

2) An automatic sputtering rate of 0.4 angstroms per second was used in the oxygen-argon mixture to a maximum thickness reading of 11,400 angstroms for the hafnium oxide. The results obtained were substantially similar to those obtained with Example I.

It will be understood that the present method can be carried out utilizing parameters which differ somewhat from those specified above and that the resulting coating can differ somewhat in its thickness and the relative thicknesses of the layers of which it is composed. Various other modifications, changes, alterations and additions in the present method, its steps and parameters and in the present composite, its components and parameters can be made. All such modifications, changes, alterations and additions as are within the scope of the appended claims form part of the present invention.

What is claimed is:

1. An improved oxidation-resistant diamond composite, said composite comprising, in combination:
    a) a diamond having a plurality of surfaces; and
    b) an oxidation-resistant protective coating deposited on, and chemically bonded to, said diamond surfaces; said coating comprising:
        i) a hafnium carbide layer not in excess of about 200 angstroms thick chemically bonded directly to said diamond surfaces,
        ii) a hafnium oxy-carbide layer not in excess of about 600 angstroms thick chemically bonded to said hafnium carbide layer, and
        iii) an oxidation-resistant hafnium oxide layer having an about one-quarterwavelength optical thickness chemically bonded to said hafnium oxy-carbide layer, whereby said coating is anti-reflective, transparent, tenaciously adherent to said diamond surfaces and resistant to oxidation at elevated temperatures.

* * * * *